(12) United States Patent
Saito

(10) Patent No.: US 8,016,967 B2
(45) Date of Patent: Sep. 13, 2011

(54) MULTILAYER CERAMIC SUBSTRATE, METHOD FOR MANUFACTURING THE SAME, AND METHOD FOR REDUCING SUBSTRATE WARPING

(75) Inventor: Yoshifumi Saito, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/605,442

(22) Filed: Oct. 26, 2009

(65) Prior Publication Data
US 2010/0035033 A1 Feb. 11, 2010

Related U.S. Application Data

(63) Continuation of application No. PCT/JP2008/072253, filed on Dec. 8, 2008.

(30) Foreign Application Priority Data

Jan. 11, 2008 (JP) ................... 2008-003866

(51) Int. Cl.
C03B 29/00 (2006.01)
B32B 7/02 (2006.01)
B32B 19/00 (2006.01)

(52) U.S. Cl. .................... 156/89.11; 156/89.12; 156/64; 428/699; 428/213

(58) Field of Classification Search .............. 156/89.11
See application file for complete search history.

(56) References Cited

U.S. PATENT DOCUMENTS

| 6,395,118 | B1 | 5/2002 | Sakamoto et al. | |
| 2002/0050316 | A1* | 5/2002 | Sakamoto et al. | 156/89.12 |
| 2003/0008182 | A1 | 1/2003 | Saitoh et al. | |
| 2005/0269012 | A1* | 12/2005 | Saito | 156/89.11 |

FOREIGN PATENT DOCUMENTS

| JP | 5-237820 A | 9/1993 |
| JP | 2000-277914 A | 10/2000 |
| JP | 2004-165295 A | 6/2004 |

OTHER PUBLICATIONS

Official Communication issued in International Patent Application No. PCT/JP2008/072253, mailed on Jan. 27, 2009.
Official Communication issued in corresponding Chinese Patent Application No. 200880013670.X, mailed on May 9, 2011.

* cited by examiner

*Primary Examiner* — Philip Tucker
*Assistant Examiner* — Alex Efta
(74) *Attorney, Agent, or Firm* — Keating & Bennett, LLP

(57) ABSTRACT

In the manufacture of a multilayer ceramic substrate including a ceramic laminate by a so-called non-shrink process in which the ceramic laminate disposed between shrinkage control layers is fired, first and second surface conductive films formed on first and second main surfaces of the ceramic laminate may cause warping of the multilayer ceramic substrate after the shrinkage control layers are removed. After the firing step, in removing the shrinkage control layers from a composite laminate, the thickness of at least one of first and second reaction layers formed at interfaces between ceramic green layers and the shrinkage control layers in the firing step is reduced such that the thickness of the first reaction layer is different from the thickness of the second reaction layer, thereby controlling the compressive stress generated by the reaction layers to reduce the warping of the multilayer ceramic substrate.

5 Claims, 3 Drawing Sheets

000# MULTILAYER CERAMIC SUBSTRATE, METHOD FOR MANUFACTURING THE SAME, AND METHOD FOR REDUCING SUBSTRATE WARPING

BACKGROUND OF THE INVENTION

1. Field of the Invention

The present invention relates to a multilayer ceramic substrate, a method for manufacturing the multilayer ceramic substrate, and a method for reducing the warping of the multilayer ceramic substrate and, in particular, to a method for manufacturing a multilayer ceramic substrate using a so-called non-shrink process, a multilayer ceramic substrate manufactured by this manufacturing method, and a method for reducing the warping of the multilayer ceramic substrate.

2. Description of the Related Art

In the manufacture of a multilayer ceramic substrate by a so-called non-shrink process, a composite laminate is first prepared. The composite laminate includes a green ceramic laminate and first and second shrinkage control layers disposed on opposite surfaces (first and second main surfaces, respectively) of the green ceramic laminate. The green ceramic laminate includes a plurality of ceramic green layers each containing a material that can be fired at a low temperature (hereinafter referred to as a low-temperature firing ceramic material). The first and second shrinkage control layers contain a powder formed of an inorganic material that cannot be sintered under sintering conditions of the low-temperature firing ceramic material.

The composite laminate is then fired under the sintering conditions of the low-temperature firing ceramic material. In this firing process, since the inorganic material is not substantially sintered, the first and second shrinkage control layers will not substantially shrink. The first and second shrinkage control layers can therefore reduce the shrinkage of the ceramic laminate along the main surfaces, thus increasing the dimensional accuracy of the ceramic laminate and consequently increasing the dimensional accuracy of a multilayer ceramic substrate including the ceramic laminate. In the firing process, it is known that the low-temperature firing ceramic material chemically reacts with the inorganic material along an interface between a shrinkage control layer and a ceramic green layer to form a reaction layer.

The first and second shrinkage control layers are then removed, for example, by abrasive blasting, to manufacture a desired multilayer ceramic substrate.

According to a method for manufacturing a multilayer ceramic substrate by a non-shrink process, therefore, a multilayer ceramic substrate can be manufactured with high dimensional accuracy particularly along the main surfaces. However, variations in the distribution of conductive portions, such as conductor films and via conductors, in a green ceramic laminate, which is to become a multilayer ceramic substrate, and in the thickness and composition of a ceramic green layer may cause the warping of the multilayer ceramic substrate in the firing process. In particular, a surface conductive film on a main surface of a green ceramic laminate is known to have a large effect on the warping of a multilayer ceramic substrate.

Japanese Unexamined Patent Application Publication No. 2001-60767 has proposed altering the thickness of a first shrinkage control layer relative to a second shrinkage control layer to reduce the warping. PCT International Publication No. WO 2002/043455 has proposed altering the particle size of an inorganic material powder in a first shrinkage control layer relative to that in a second shrinkage control layer.

However, even when the warping in the firing process is reduced as described above, removal of shrinkage control layers may cause new or additional warping. This will be described below with reference to FIG. 6.

FIG. 6 is a cross-sectional view of a composite laminate 1 after a firing process is completed and a first shrinkage control layer 6 (broken line) is removed.

The composite laminate 1 includes a ceramic laminate 2, which is composed of a plurality of ceramic layers 3 each formed of a sintered low-temperature firing ceramic material. Conductor films and via conductors associated with the ceramic laminate 2 are not shown in FIG. 6. A first shrinkage control layer 6 and a second shrinkage control layer 7 are disposed on opposite surfaces (a first main surface 4 and a second main surface 5, respectively) of the ceramic laminate 2. A first reaction layer 8 and a second reaction layer 9 are disposed between the ceramic laminate 2 and the first and second shrinkage control layers 6 and 7.

First, removal of the first shrinkage control layer 6 by abrasive blasting in the direction indicated by an arrow 10 releases the compressive stress acting on the ceramic laminate 2, thus causing a convex warp on the first main surface 4. Second, removal of the second shrinkage control layer 7 also releases the compressive stress acting on the second main surface 5, thus making the ceramic laminate 2 substantially flat.

However, in such removal of the shrinkage control layers 6 and 7, variations in the distribution of conductive portions, such as conductor films and via conductors, in the ceramic laminate 2 and the thickness and composition of the ceramic layers 3 may cause non-uniform compressive stress, thus leaving a warp of a multilayer ceramic substrate composed of the ceramic laminate 2. Furthermore, it is also known that such warping is greatly affected by surface conductive films disposed on the main surfaces 4 and 5 of the ceramic laminate 2.

SUMMARY OF THE INVENTION

In view of the above, preferred embodiments of the present invention provide a multilayer ceramic substrate, a method for manufacturing a multilayer ceramic substrate, and a method for reducing the warping of a multilayer ceramic substrate during manufacturing, in which warping caused by removal of a shrinkage control layer is reduced and prevented.

A method for manufacturing a multilayer ceramic substrate according to a preferred embodiment of the present invention includes the steps of preparing a composite laminate that includes a green ceramic laminate and first and second shrinkage control layers disposed on opposite first and second main surfaces of the ceramic laminate, the green ceramic laminate including a plurality of ceramic green layers each containing a low-temperature firing ceramic material, the first and second shrinkage control layers containing a powder of an inorganic material that cannot be sintered under sintering conditions of the low-temperature firing ceramic material; firing the composite laminate under conditions such that the low-temperature firing ceramic material is sintered and chemically reacts with the inorganic material to form first and second reaction layers along an interface between the first shrinkage control layer and the ceramic green layers and an interface between the second shrinkage control layer and the ceramic green layers; and removing the first and second shrinkage control layers from the fired composite laminate.

To solve the above-mentioned technical problems, in the method for manufacturing a multilayer ceramic substrate, the removing step includes reducing the thickness of at least one of the first and second reaction layers such that the thickness of the first reaction layer is different from the thickness of the second reaction layer.

Preferably, the method for manufacturing a multilayer ceramic substrate further includes forming first and second surface conductive films on the first and second main surfaces of the ceramic laminate, respectively, wherein the area of the second surface conductive film is smaller than the area of the first surface conductive film, and the thickness of the second reaction layer is smaller than the thickness of the first reaction layer in the removing step.

In this case, the first and second main surfaces of the ceramic laminate include first and second conductor-free regions in which the first and second surface conductive films are not formed. Preferably, the volume of a portion of the first reaction layer in the first conductor-free region is substantially the same as the volume of a portion of the second reaction layer in the second conductor-free region in the removing step.

In a method for manufacturing a multilayer ceramic substrate according to a preferred embodiment of the present invention, preferably, the removing step includes abrasive blasting of the shrinkage control layers.

The present invention is also directed to a multilayer ceramic substrate manufactured by such a manufacturing method.

A multilayer ceramic substrate according to another preferred embodiment of the present invention includes a ceramic laminate including a plurality of ceramic layers each defined by a sintered compact of a low-temperature firing ceramic material, and first and second reaction layers disposed on opposite first and second main surfaces of the ceramic laminate, respectively, the first and second reaction layers being formed by a chemical reaction between the low-temperature firing ceramic material and an inorganic material that cannot be sintered under sintering conditions of the low-temperature firing ceramic material, wherein the thickness of the first reaction layer is different from the thickness of the second reaction layer.

Preferably, a multilayer ceramic substrate according to a preferred embodiment of the present invention further includes first and second surface conductive films on the first and second main surfaces of the ceramic laminate, respectively, wherein the area of the second surface conductive film is smaller than the area of the first surface conductive film, and the thickness of the second reaction layer is smaller than the thickness of the first reaction layer.

In this case, the first and second main surfaces of the ceramic laminate include first and second conductor-free regions in which the first and second surface conductive films are not formed. Preferably, the volume of a portion of the first reaction layer in the first conductor-free region is substantially the same as the volume of a portion of the second reaction layer in the second conductor-free region.

According to yet another preferred embodiment of the present invention, a method for reducing the warping of a multilayer ceramic substrate during manufacturing includes the steps of: preparing a composite laminate that includes a green ceramic laminate and first and second shrinkage control layers disposed on opposite first and second main surfaces of the ceramic laminate, the green ceramic laminate including a plurality of ceramic green layers each containing a low-temperature firing ceramic material, the first and second shrinkage control layers containing a powder of an inorganic material that cannot be sintered under sintering conditions of the low-temperature firing ceramic material; firing the composite laminate under conditions such that the low-temperature firing ceramic material is sintered and chemically reacts with the inorganic material to form first and second reaction layers along an interface between the first shrinkage control layer and the ceramic green layers and an interface between the second shrinkage control layer and the ceramic green layers; and removing the first and second shrinkage control layers from the fired composite laminate.

A method for reducing the warping of a multilayer ceramic substrate according to a preferred embodiment of the present invention includes preparatory steps of manufacturing a multilayer ceramic substrate of a predetermined design by the manufacturing method, evaluating the warping of the multilayer ceramic substrate, and determining the thicknesses of the first and second reaction layers from the warping of the multilayer ceramic substrate to reduce the warping, and a subsequent main step of reducing the thickness of at least one of the first and second reaction layers in the removing step to achieve the thicknesses of the first and second reaction layers determined to reduce the warping, while the manufacturing method is being performed.

Although the first and second reaction layers formed in the firing process exert compressive stress on the ceramic laminate, according to a preferred embodiment of the present invention, the thickness of at least one of the first and second reaction layers is reduced to adjust the balance between the compressive stress caused by the first reaction layer and the compressive stress caused by the second reaction layer, thus reducing the warping of the multilayer ceramic substrate. This can improve the manufacturing yield of the multilayer ceramic substrate, increase the area of the multilayer ceramic substrate, and thereby increase the production efficiency of the multilayer ceramic substrate.

In a preferred embodiment of the present invention, when first and second surface conductive films are formed on first and second main surfaces of a ceramic laminate, respectively, a reaction layer has a smaller thickness on the surface conductive films than on a conductor-free region in which no surface conductive film is formed on the first and second main surfaces, or little or no reaction layer is formed on the surface conductive films. Thus, a region in which a surface conductive film is formed undergoes a smaller compressive stress from the reaction layer than the conductor-free region. When the area of the second surface conductive film is smaller than the area of the first surface conductive film, if the thickness of the second reaction layer is smaller than the thickness of the first reaction layer, the warping of the multilayer ceramic substrate can be reduced more properly.

When the area of the second surface conductive film is smaller than the area of the first surface conductive film, if the volume of a portion of the first reaction layer in a first conductor-free region in which no first surface conductive film is formed on the first main surface of the ceramic laminate is substantially the same as the volume of a portion of the second reaction layer in a second conductor-free region in which no second surface conductive film is formed on the second main surface, the warping of the multilayer ceramic substrate can be reduced more properly.

When the removing step in a method for manufacturing a multilayer ceramic substrate according to a preferred embodiment of the present invention involves abrasive blasting, the discharge pressure, the discharge time, or the particle size of an abrasive material can be easily altered to control the thickness of a reaction layer.

A method for reducing the warping of a multilayer ceramic substrate according to a preferred embodiment of the present invention includes a preparatory step of determining the thicknesses of the first and second reaction layers to reduce the warping of the multilayer ceramic substrate, and a subsequent main step of reducing the thickness of at least one of the first and second reaction layers in the removing step to achieve the thicknesses of the first and second reaction layers determined to reduce the warping. Thus, the method for reducing substrate warping has high mass productivity. Furthermore, there is no need to control the thickness of a shrinkage control layer or the particle size of an inorganic material powder contained in the shrinkage control layer, complicated process control can be avoided.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
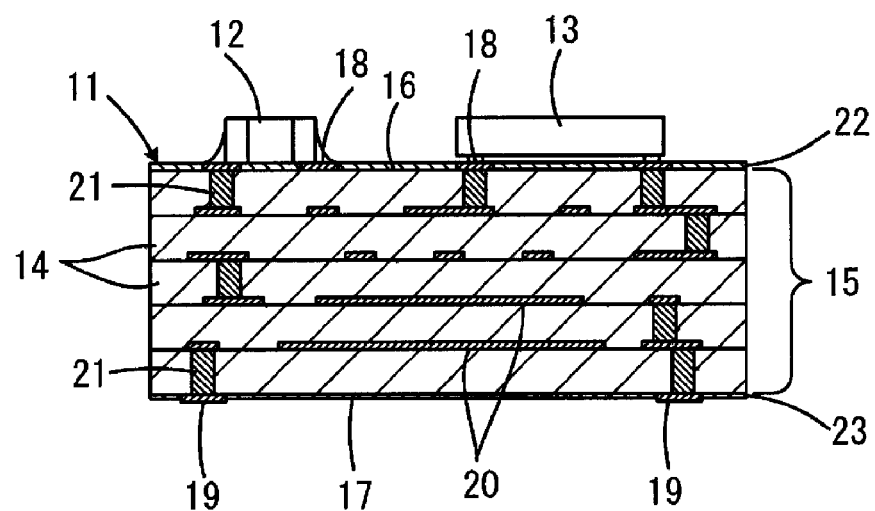
FIG. 1 is a cross-sectional view of a multilayer ceramic substrate 11 according to one preferred embodiment of the present invention, with components 12 and 13 being mounted thereon.
Figure 2:
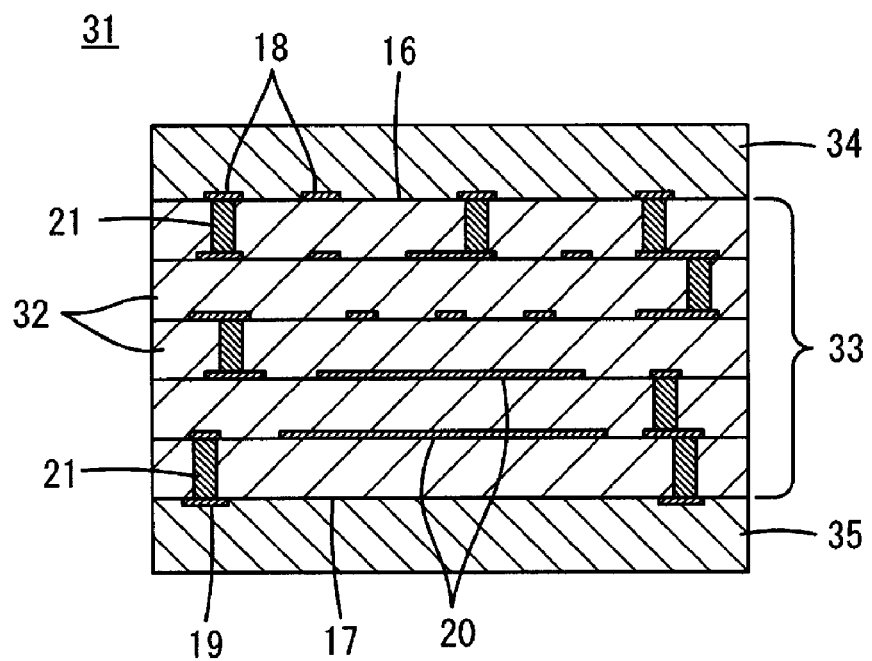
FIG. 2 is a cross-sectional view of a composite laminate 31 for use in the manufacture of the multilayer ceramic substrate 11 illustrated in FIG. 1.
Figure 3:
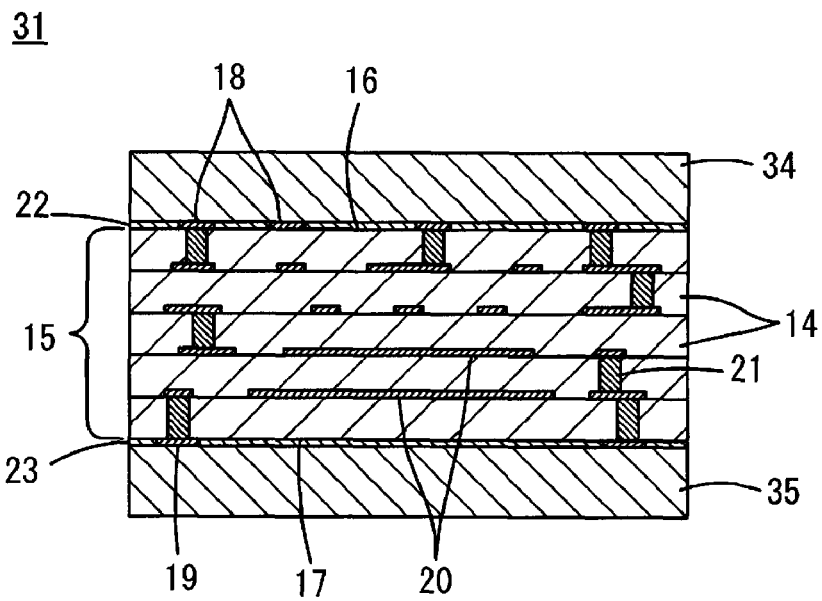
FIG. 3 is a cross-sectional view of the composite laminate 31 illustrated in FIG. 2 after firing.
Figure 4:
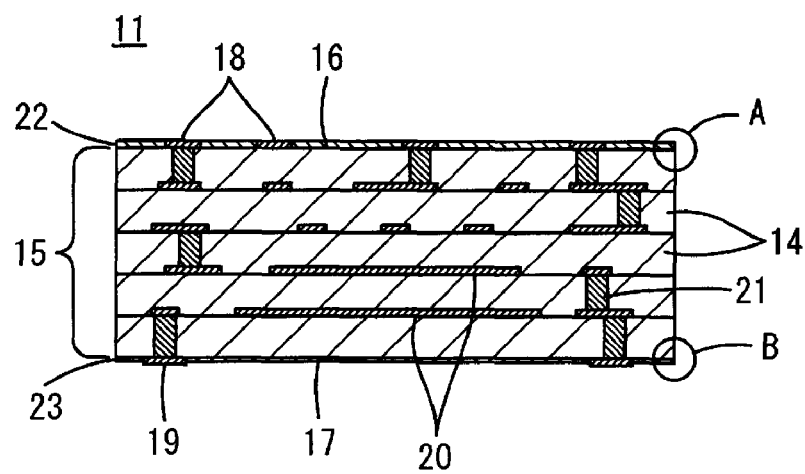
FIG. 4 is a cross-sectional view of the composite laminate 31 illustrated in FIG. 3 after shrinkage control layers 34 and 35 are removed.
Figure 5A:
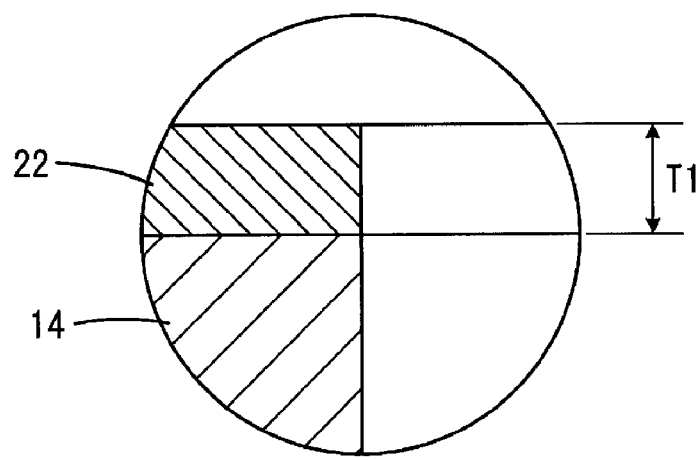
FIGS. 5A and 5B are enlarged views of portions A and B in FIG. 4.
Figure 5B:
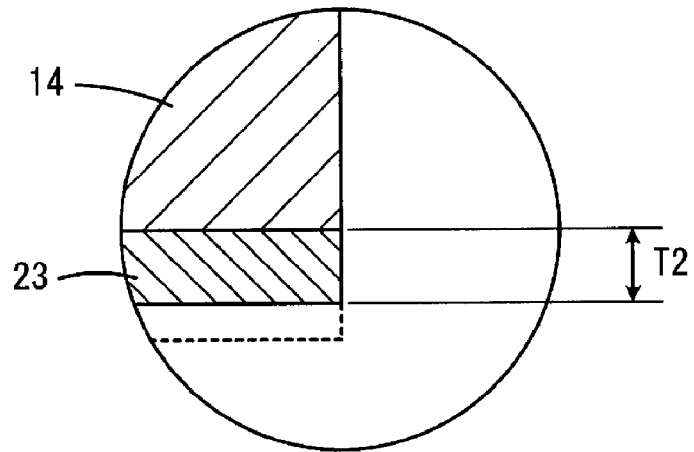
Figure 6:
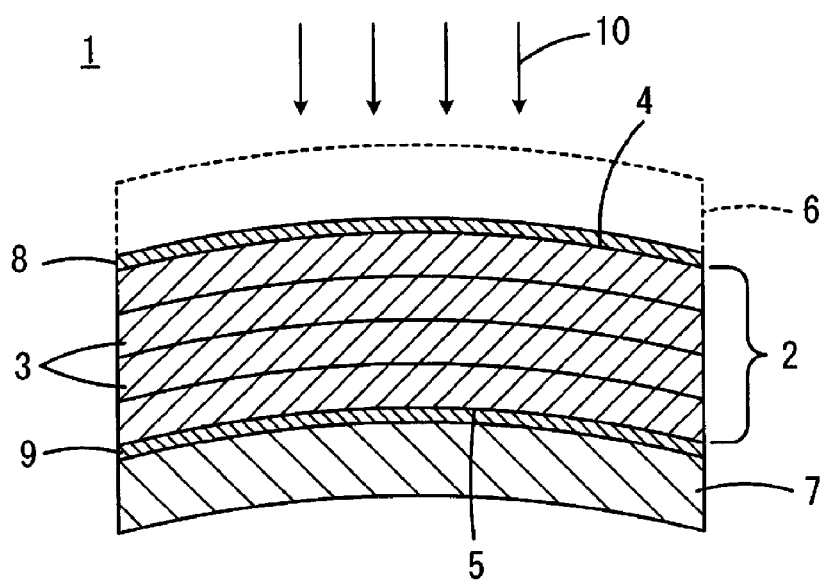
FIG. 6 is a cross-sectional view of a composite laminate 1 for use in a conventional method for manufacturing a multilayer ceramic substrate after a shrinkage control layer 6 is removed.

FIGS. 1 to 5B illustrate a preferred embodiment of the present invention. More specifically, FIG. 1 is a cross-sectional view of a multilayer ceramic substrate 11 according to a preferred embodiment of the present invention, with components 12 and 13 being mounted thereon. FIGS. 2 to 4 illustrate a method for manufacturing the multilayer ceramic substrate 11 illustrated in FIG. 1. FIGS. 5A and 5B are enlarged views of portions A and B in FIG. 4, respectively.

With reference to FIG. 1, a multilayer ceramic substrate 11 includes a ceramic laminate 15, which includes a plurality of ceramic layers 14 each defined by a sintered low-temperature firing ceramic material. Several first and second surface conductive films 18 and 19 are disposed on opposite first and second main surfaces 16 and 17 of the ceramic laminate 15, respectively. The area (total area) of the second surface conductive films 19 is smaller than the area (total area) of the first surface conductive films 18. The ceramic laminate 15 includes internal conductor films 20 and via conductors 21.

First and second reaction layers 22 and 23 are formed on the first and second main surfaces 16 and 17 of the ceramic laminate 15, respectively. As will be clear from the undermentioned manufacturing method, the reaction layers 22 and 23 are formed by a chemical reaction between the low-temperature firing ceramic material and an inorganic material that cannot be sintered under sintering conditions of the low-temperature firing ceramic material. The thickness of the second reaction layer 23 is smaller than the thickness of the first reaction layer 22. The volume of a portion of the first reaction layer 22 in a first conductor-free region in which the first surface conductive films 18 are not formed on the first main surface 16 is substantially the same as the volume of a portion of the second reaction layer 23 in a second conductor-free region in which the second surface conductive films 19 are not formed on the second main surface 17. The reason for that will be described later.

The components 12 and 13 mounted on the multilayer ceramic substrate 11 are electrically connected to a portion of the first surface conductive films 18 disposed on the first main surface 16 of the ceramic laminate 15.

A method for manufacturing a multilayer ceramic substrate 11 will be described below with reference to FIGS. 2 to 5B.

A composite laminate 31 illustrated in FIG. 2 is prepared. The composite laminate 31 includes a green ceramic laminate 33, which includes a plurality of ceramic green layers 32 each containing a low-temperature firing ceramic material. The green ceramic laminate 33 is converted into the ceramic laminate 15 in the firing step described below. The green ceramic laminate 33 includes the first and second surface conductive films 18 and 19, the internal conductor films 20, and the via conductors 21. In the step illustrated in FIG. 2, the conductor films 18 to 20 and the via conductors 21 are formed of electroconductive paste.

First and second shrinkage control layers 34 and 35 are disposed on the opposite first and second main surfaces 16 and 17 of the green ceramic laminate 33. The shrinkage control layers 34 and 35 contain a powder of an inorganic material that cannot be sintered under sintering conditions of the low-temperature firing ceramic material.

The composite laminate 31 is then fired. FIG. 3 illustrates the composite laminate 31 after firing. The firing step is performed under sintering conditions of the low-temperature firing ceramic material contained in the ceramic green layers 32. Thus, the firing step converts the green ceramic laminate 33 into the sintered ceramic laminate 15. The electroconductive paste of the conductor films 18 to 20 and the via conductors 21 is also sintered in the firing step.

In the firing step, since the inorganic material contained in the first and second shrinkage control layers 34 and 35 is not substantially sintered, the first and second shrinkage control layers 34 and 35 do not substantially shrink. The first and second shrinkage control layers 34 and 35 therefore reduce the shrinkage of the green ceramic laminate 33 along the main surfaces, thus increasing the dimensional accuracy of the ceramic laminate 15 in the sintering process.

Also in the firing step, the first and second reaction layers 22 and 23 are formed along an interface between the ceramic green layers 32 and the first shrinkage control layer 34 and an interface between the ceramic green layers 32 and the second shrinkage control layer 35. The reaction layers 22 and 23 are formed in the firing step by a chemical reaction between the low-temperature firing ceramic material contained in the ceramic green layers 32 and the inorganic material contained in the shrinkage control layers 34 and 35. In this step, the first and second reaction layers 22 and 23 have substantially the same thickness.

The term "chemical reaction", as used herein, means that component elements contained in the low-temperature firing ceramic material are mixed at the atomic level with component elements contained in the inorganic material. The mixture at the atomic level may or may not generate a new crystal phase from the component elements contained in the low-temperature firing ceramic material and the component elements contained in the inorganic material. When no crystal phase is formed, component elements contained in one of the low-temperature firing ceramic material and the inorganic material may diffuse into, dissolve into, or form a solid solution with a glass phase, an amorphous phase, or a crystal phase contained in the other of the low-temperature firing ceramic material and the inorganic material.

The reaction layers 22 and 23 may be formed on the surface conductive films 18 and 19. However, the thicknesses of the reaction layers 22 and 23 formed on the surface conductive films 18 and 19 are smaller than the thicknesses of the reaction layers 22 and 23 in a conductor-free region in which the surface conductive films 18 and 19 are not formed. The reaction layers 22 and 23 formed on the surface conductive films 18 and 19 are formed by a chemical reaction between the glass component contained in the electroconductive paste and the inorganic material contained in the shrinkage control layers 34 and 35.

In the next removing step, the first and second shrinkage control layers 34 and 35 are removed from the composite laminate 31 to produce the multilayer ceramic substrate 11 illustrated in FIG. 4. In the removing step, which is a characteristic step of a preferred embodiment of the present invention, the thickness of at least one of the first and second reaction layers 22 and 23 is reduced such that the thickness of the first reaction layer 22 is different from the thickness of the second reaction layer 23.

As described above, the area of the second surface conductive films 19 on the second main surface 17 of the ceramic laminate 15 is smaller than the area of the first surface conductive films 18 on the first main surface 16. Thus, as illustrated in FIG. 5, the thickness T2 of the second reaction layer 23 is smaller than the thickness T1 of the first reaction layer 22 in the removing step. The reason for that is described below.

As described above, the first and second reaction layers 22 and 23 may also be formed on the first and second surface conductive films 18 and 19. However, the reaction layers 22 and 23 formed on the surface conductive films 18 and 19 have a small thickness and do not generate significant compressive stress. Thus, the compressive stress exerted on a portion of the reaction layers 22 and 23 in a conductor-free region in which the surface conductive films 18 and 19 are not formed has a large effect on the warping of the multilayer ceramic substrate 11.

Consequently, the compressive stress due to the second reaction layer 23 exerted on the second main surface 17 on which the second surface conductive films 19 having a smaller area or the conductor-free region having a larger area is formed is larger than the compressive stress due to the first reaction layer 22 exerted on the first main surface 16 on which the first surface conductive films 18 having a larger area or the conductor-free region having a smaller area is formed.

As indicated by the broken line and the solid line in FIG. 5B, therefore, the thickness of the second reaction layer 23 is principally reduced to adjust the balance of compressive stress. Thus, the thickness T2 of the second reaction layer 23 becomes smaller than the thickness T1 of the first reaction layer 22. Preferably, the volume of a portion of the first reaction layer 22 in the first conductor-free region in which the first surface conductive films 18 are not formed on the first main surface 16 is substantially the same as the volume of a portion of the second reaction layer 23 in the second conductor-free region in which the second surface conductive films 19 are not formed on the second main surface 17.

Preferably, the removing step involves abrasive blasting. This is because the particle size, the discharge pressure, or the discharge time of an abrasive material can be easily altered to control the thicknesses T1 and T2 of the first and second reaction layers 22 and 23. For example, the particle size of an abrasive material, such as an alumina powder, driven by compressed air can be altered to control the thicknesses T1 and T2 of the first and second reaction layers 22 and 23. The pressure of compressed air for blasting an abrasive material, such as an alumina powder, can also be altered to control the thicknesses T1 and T2 of the first and second reaction layers 22 and 23. The compressed air having a pressure preferably in the range of about 98 kPa to about 343 kPa, for example, is blown together with an abrasive material, such as an alumina powder. Compressed air having an excessively low pressure below about 98 kPa cannot satisfactorily remove the shrinkage control layers 34 and 35, thus lowering the productivity. On the other hand, compressed air having an excessively high pressure above about 343 kPa may accelerate the deterioration of a nozzle, increase the compressed air consumption and running costs, or cause damage to the multilayer ceramic substrate 11. The pressure of compressed air herein refers to the pressure of compressed air in a pipe before blasting.

Through these steps, the multilayer ceramic substrate 11 illustrated in FIG. 4 is prepared.

The mass production of such a multilayer ceramic substrate includes preparatory steps of providing a composite laminate by a general manufacturing method, firing the composite laminate, removing the first and second shrinkage control layers from the composite laminate to form a multilayer ceramic substrate of a predetermined design, evaluating the warping of the multilayer ceramic substrate, and determining the thicknesses of the first and second reaction layers from the warping of the multilayer ceramic substrate to reduce the warping.

The mass production of such a multilayer ceramic substrate further includes a subsequent main step of reducing the thickness of at least one of the first and second reaction layers in the step of removing the shrinkage control layers to achieve the thicknesses of the first and second reaction layers determined to reduce the warping, while the manufacturing method is being performed. Thus, a multilayer ceramic substrate can be manufactured in large quantities without causing significant warping.

Experimental examples performed to demonstrate the advantages of various preferred embodiments of the present invention will be described below.

A crystallized glass powder of $SiO_2$, $Al_2O_3$, $B_2O_3$, and CaO was mixed with an alumina powder at a weight ratio of 1:1. A hundred parts by weight of the mixed powder was mixed in a ball mill with 15 parts by weight of poly(vinyl butyral), 40 parts by weight of isopropyl alcohol, and 20 parts by weight of toluene for 24 hours to prepare a slurry. The slurry was formed into a ceramic green sheet having a thickness of 120 µm by a doctor blade method. The ceramic green sheet was cut into green sheets 135 mm square for a ceramic layer.

A hundred parts by weight of an alumina powder having an average particle size of 1.0 µm, 15 parts by weight of poly(vinyl butyral), 40 parts by weight of isopropyl alcohol, and 20 parts by weight of toluene were mixed in a ball mill for 24 hours to prepare a slurry. The slurry was formed into a ceramic green sheet having a thickness of 120 µm by a doctor blade method. The ceramic green sheet was cut into green sheets 135 mm square for a shrinkage control layer.

A plurality of green sheets for a ceramic layer specified by "number of laminated ceramic layers" in Table 1 were stacked to form a green ceramic laminate. Surface conductive films were formed on first and second main surfaces of the green ceramic laminate at an area ratio described in "area ratio of conductor films" in Table 1. Three green sheets for a shrinkage control layer were placed on each of the first and second main surfaces of the green ceramic laminate and were pressed at a pressure of 50 MPa and a temperature of 60° C. to form a composite laminate.

The composite laminate was placed on an alumina plate, which had a curvature of 0.05% or less per unit length along a main surface and a porosity of 70%, was heated at a temperature of 600° C. for three hours, and was fired at a temperature of 900° C. for one hour to sinter the ceramic laminate alone.

Water and 147 kPa compressed air were blown for 120 seconds to remove the shrinkage control layers together with the reaction layers. A slurry containing 30% alumina powder having an average particle size of 30 μm was blown with compressed air having a regulated pressure in the range of 98 to 343 kPa for 120 seconds to achieve the thicknesses of the reaction layers satisfying the "reaction layer thickness ratio" in Table 1. After the thicknesses of the reaction layers were adjusted, the warping of the multilayer ceramic substrate was determined. The results are shown in "substrate warping" in Table 1.

"Substrate warping at a reaction layer thickness ratio of 1:1" in Table 1 shows the warping of multilayer ceramic substrates according to comparative examples at a reaction layer thickness ratio of 1:1.

TABLE 1

| | | Sample number | | | | |
|---|---|---|---|---|---|---|
| | | 1 | 2 | 3 | 4 | 5 |
| Area ratio of conductor films | First main surface | 60% | 60% | 50% | 40% | 60% |
| | Second main surface | 10% | 10% | 20% | 30% | 10% |
| Number of laminated ceramic layers | | 10 | 5 | 10 | 5 | 10 |
| Reaction layer thickness ratio (first reaction layer:second reaction layer) | | 6:1 | 6:1 | 5:2 | 4:3 | 9:4 |
| Substrate warping | | <0.1% | <0.1% | <0.1% | <0.1% | <0.1% |
| Substrate warping at a reaction layer thickness ratio of 1:1 | | 0.5% | 1.0% | 0.45% | 0.4% | 0.5% |

Table 1 shows that the reaction layer thickness ratio can be altered to reduce the substrate warping below 0.1%, and the warping can be greatly reduced as compared with the substrate warping at a reaction layer thickness ratio of 1:1.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a multilayer ceramic substrate, comprising the steps of:
preparing a composite laminate that includes a green ceramic laminate and first and second shrinkage control layers disposed on opposite first and second main surfaces of the ceramic laminate, the green ceramic laminate including a plurality of ceramic green layers each containing a low-temperature firing ceramic material, the first and second shrinkage control layers containing a powder of an inorganic material that cannot be sintered under sintering conditions of the low-temperature firing ceramic material;
firing the composite laminate under conditions such that the low-temperature firing ceramic material is sintered and chemically reacts with the inorganic material to form first and second reaction layers along an interface between the first shrinkage control layer and the ceramic green layers and an interface between the second shrinkage control layer and the ceramic green layers;
removing the first and second shrinkage control layers from the fired composite laminate; wherein
the step of removing includes a step of reducing a thickness of at least the second reaction layer such that a ratio of a thickness of the first reaction layer to the thickness of the second reaction layer is between 4:3 and 6:1; and
the multilayer ceramic substrate produced after the method of manufacturing has been completed includes the first and second reaction layers remaining after the step of reducing.

2. The method for manufacturing a multilayer ceramic substrate according to claim 1, further comprising forming first and second surface conductive films on the first and second main surfaces of the ceramic laminate, respectively, wherein an area of the second surface conductive film is smaller than an area of the first surface conductive film, and the thickness of the second reaction layer is smaller than the thickness of the first reaction layer in the removing step.

3. The method for manufacturing a multilayer ceramic substrate according to claim 2, wherein the first and second main surfaces of the ceramic laminate include first and second conductor-free regions in which the first and second surface conductive films are not formed, and a volume of a portion of the first reaction layer in the first conductor-free region is substantially the same as a volume of a portion of the second reaction layer in the second conductor-free region in the removing step.

4. The method for manufacturing a multilayer ceramic substrate according to claim 1, wherein the step of removing includes abrasive blasting of the shrinkage control layers.

5. A method for reducing warping of a multilayer ceramic substrate comprising the steps of:

preparing a composite laminate that includes a green ceramic laminate and first and second shrinkage control layers disposed on opposite first and second main surfaces of the ceramic laminate, the green ceramic laminate including a plurality of ceramic green layers each containing a low-temperature firing ceramic material, the first and second shrinkage control layers containing a powder of an inorganic material that cannot be sintered under sintering conditions of the low-temperature firing ceramic material;

firing the composite laminate under conditions such that the low-temperature firing ceramic material is sintered and chemically reacts with the inorganic material to form first and second reaction layers along an interface between the first shrinkage control layer and the ceramic green layers and an interface between the second shrinkage control layer and the ceramic green layers;

removing the first and second shrinkage control layers from the fired composite laminate; evaluating the warping of the multilayer ceramic substrate;

determining thicknesses of the first and second reaction layers at which the warping of the multilayer ceramic substrate is reduced; and reducing the thickness of at least the second reaction layer in the removing step to achieve the thicknesses of the first and second reaction layers determined to reduce the warping and such that a ratio of the thickness of the first reaction layer to the thickness of the second reaction layer is between 4:3 and 6:1; wherein the multilayer ceramic substrate produced after the method of manufacturing has been completed includes the first and second reaction layers remaining after the step of reducing.

* * * * *